US010629455B1

(12) United States Patent
Chen

(10) Patent No.: US 10,629,455 B1
(45) Date of Patent: Apr. 21, 2020

(54) SEMICONDUCTOR PACKAGE HAVING A BLOCKING DAM

(71) Applicant: NANYA TECHNOLOGY CORPORATION, New Taipei (TW)

(72) Inventor: Te-Yin Chen, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/215,130

(22) Filed: Dec. 10, 2018

Related U.S. Application Data

(60) Provisional application No. 62/769,929, filed on Nov. 20, 2018.

(51) Int. Cl.
*H01L 23/31* (2006.01)
*H01L 21/56* (2006.01)
*H01L 23/00* (2006.01)
*H01L 23/488* (2006.01)

(52) U.S. Cl.
CPC ........ *H01L 21/563* (2013.01); *H01L 23/3114* (2013.01); *H01L 23/488* (2013.01); *H01L 24/09* (2013.01); *H01L 24/17* (2013.01)

(58) Field of Classification Search
CPC ............ H01L 23/3114; H01L 23/3142; H01L 23/488; H01L 51/524; H01L 51/5243
See application file for complete search history.

(56) References Cited

U.S. PATENT DOCUMENTS

2010/0066209 A1* 3/2010 Saitou ...................... H03H 3/08
310/340

FOREIGN PATENT DOCUMENTS

| TW | 20050134 A | 1/2005 |
| TW | 200924622 A | 6/2009 |
| TW | 201041113 A1 | 11/2010 |

OTHER PUBLICATIONS

Office Action dated Dec. 20, 2019 related to Taiwanese Application No. 10821212530.

* cited by examiner

*Primary Examiner* — Hoai V Pham
(74) *Attorney, Agent, or Firm* — Muncy, Geissler, Olds & Lowe, PC

(57) ABSTRACT

The present disclosure relates to a semiconductor package and a method for manufacturing the same. The semiconductor package includes a first substrate, a blocking dam, and a first contact pad. The first substrate includes a chip-mounting region and an outer connecting region outside the chip-mounting region. The blocking dam is disposed over the first substrate, wherein the blocking dam is disposed between the chip-mounting region and the outer connecting region, the blocking dam surrounds the chip-mounting region and includes a metal layer, and the blocking dam is of a wave shape as seen in a top view of the blocking dam. A first contact pad is disposed over the first substrate, and the first contact pad is within the outer connecting region.

20 Claims, 3 Drawing Sheets

SEMICONDUCTOR PACKAGE HAVING A BLOCKING DAM

PRIORITY CLAIM AND CROSS-REFERENCE

This application claims the priority benefit of U.S. provisional application Ser. No. 62/769,929, filed on Nov. 20, 2018. The entirety of the above-mentioned patent application is hereby incorporated by reference herein and made a part of this specification.

TECHNICAL FIELD

The present disclosure relates to a semiconductor package and a method for manufacturing the same, and more particularly, to a semiconductor package having a blocking dam and a method for manufacturing the same.

DISCUSSION OF THE BACKGROUND

Semiconductor devices are essential for many modern applications. With the advancement of electronic technology, semiconductor devices are steadily becoming smaller while providing greater functionality and including greater amounts of integrated circuits. Due to the miniaturized scale of semiconductor devices, 3DIC structures are widely used for packaging, for example, package-on-package (POP) structures, or the like.

The 3DIC structure may include a substrate attached to another substrate, with a semiconductor chip encapsulated between the substrates to achieve a smaller package. In a 3DIC package, an underfill material may be disposed between the chip and a substrate to strengthen the attachment of the substrate and the semiconductor chip.

However, when the underfill material is filled, the underfill material may overflow and contaminate contact pads disposed within an outer connecting region. Thus, a problem with electrical connections may arise.

In addition, due to the miniaturized scale of the semiconductor device, the performance of the chip in the semiconductor device may be affected by electromagnetic disturbance caused by other adjacent chips.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor package. The semiconductor package comprises a first substrate including a chip-mounting region and an outer connecting region outside the chip-mounting region; a blocking dam disposed over the first substrate, wherein the blocking dam is disposed between the chip-mounting region and the outer connecting region, wherein the blocking dam surrounds the chip-mounting region and includes a metal layer, and the blocking dam has a wave shape as seen in a top view of the blocking dam; and a first contact pad disposed over the first substrate, wherein the first contact pad is within the outer connecting region.

In some embodiments, the blocking dam has a first section of a two-wave shape.

In some embodiments, the blocking dam includes two first segments and two second segments, the first segments are disposed and connected between the second segments, the second segments are disposed and connected between the first segments, the first segments are vertical segments, the second segments are horizontal segments, each said first segment is of a wave shape, and each said second segment is of a wave shape.

In some embodiments, the semiconductor package further comprises a semiconductor chip mounted over the chip-mounting region of the first substrate.

In some embodiments, the semiconductor package further comprises a second contact pad disposed over the outer connecting region, and the semiconductor chip is electrically connected to the second contact pad through a second connector.

In some embodiments, the semiconductor package further comprises an underfill material disposed over the first substrate, wherein the underfill material is within the chip-mounting region and in contact with the blocking dam, and the underfill material is disposed between the semiconductor chip and the first substrate.

In some embodiments, the semiconductor package further comprises a second substrate disposed over the semiconductor chip, wherein the second substrate is electrically connected to the first contact pad through a first connector, and the first connector is higher than the second connector.

In some embodiments, the semiconductor package further comprises a non-conductive layer in contact with the metal layer of the blocking dam and the second substrate.

In some embodiments, the metal layer of the blocking dam is electrically connected to a ground terminal.

Another aspect of the present disclosure provides a semiconductor package. The semiconductor package comprises a first substrate including a chip-mounting region and an outer connecting region outside the chip-mounting region; a blocking dam disposed over the first substrate, wherein the blocking dam is disposed between the chip-mounting region and the outer connecting region, the blocking dam surrounds the chip-mounting region, and the blocking dam is patterned as a chip alignment mark; and a first contact pad disposed over the first substrate, wherein the first contact pad is within the outer connecting region.

In some embodiments, the blocking dam includes a metal layer.

In some embodiments, the blocking dam includes a first segment, the semiconductor chip has a side wall adjacent to the first segment, and the side wall is parallel to the first segment.

In some embodiments, the blocking dam includes two first segments and two second segments, wherein the first segments are disposed and connected between the second segments, the second segments are disposed and connected between the first segments, the first segments are vertical and straight segments, and the second segments are horizontal and straight segments.

In some embodiments, the semiconductor package further comprises a semiconductor chip mounted over the chip-mounting region of the first substrate, wherein the semiconductor chip is electrically connected to the second contact pad through a second connector.

In some embodiments, the semiconductor package further comprises an underfill material disposed over the first substrate, wherein the underfill material is within the chip-mounting region and in contact with the blocking dam and the underfill material is disposed between the semiconductor chip and the first substrate.

In some embodiments, the semiconductor package further comprises a second substrate disposed over the semiconductor chip, wherein the second substrate is electrically connected to the first contact pad through a first connector, and the first connector is taller than the second connector.

Another aspect of the present disclosure provides a method for manufacturing a semiconductor package, comprising: providing a first substrate including a chip-mounting region and an outer connecting region outside the chip-mounting region; and forming a blocking dam over the first substrate, wherein the blocking dam is disposed between the chip-mounting region and the outer connecting region, the blocking dam surrounds the chip-mounting region and includes a metal layer, the blocking dam is of a wave shape as seen in a top view of the blocking dam, a first contact pad is disposed over the first substrate, and the first contact pad is within the outer connecting region.

In some embodiments, the method further comprises: forming a second contact pad over the first substrate and forming a second connector on the second contact pad, wherein the second contact pad is within the chip-mounting region; mounting a semiconductor chip over the chip-mounting region of the first substrate, wherein the semiconductor chip is electrically coupled to the second contact pad through the second connector; and filling an underfill material between the semiconductor chip and the first substrate, wherein the underfill material is within the chip-mounting region.

In some embodiments, the method further comprises: forming a first connector on the first contact pad, wherein the first connector is taller than the second connector; and disposing a second substrate over the semiconductor chip, wherein the second substrate is electrically connected to the first contact pad through the first connector.

In some embodiments, the method further comprises: electrically coupling the metal layer of the blocking dam to a ground terminal.

Another aspect of the present disclosure provides a method for manufacturing a semiconductor package, comprising: providing a first substrate including a chip-mounting region and an outer connecting region outside the chip-mounting region; and forming a blocking dam over the first substrate, wherein the blocking dam is disposed between the chip-mounting region and the outer connecting region, the blocking dam surrounds the chip-mounting region, and the blocking dam is patterned as a chip alignment mark, wherein a first contact pad is disposed over the first substrate, and the first contact pad is within the outer connecting region.

In some embodiments, the blocking dam is formed through a chemical vapor deposition (CVD) process.

In some embodiments, the method further comprises: forming a second contact pad over the first substrate and forming a second connector on the second contact pad, wherein the second contact pad is within the chip-mounting region; mounting a semiconductor chip over the chip-mounting region of the first substrate, wherein the semiconductor chip is electrically coupled to the second contact pad through the second connector; and filling an underfill material between the semiconductor chip and the first substrate, wherein the underfill material is within the chip-mounting region.

In some embodiments, the method further comprises: forming a first connector on the first contact pad, wherein the first connector is taller than the second connector; and disposing a second substrate over is the semiconductor chip, wherein the second substrate is electrically connected to the first contact pad through the first connector.

With the design of the semiconductor package, the semiconductor package may include the blocking dam to prevent the underfill material from overflowing.

In addition, the blocking dam includes a metal layer and has a wave shape, so the semiconductor package can protect the chip thereof from electromagnetic disturbance caused by other adjacent semiconductor chips.

In addition, the blocking dam can function as a chip alignment mark for mounting a semiconductor chip in a correct position. Thus, the blocking dam does not occupy more space than conventional semiconductor packages.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

DETAILED DESCRIPTION

Figure 1:
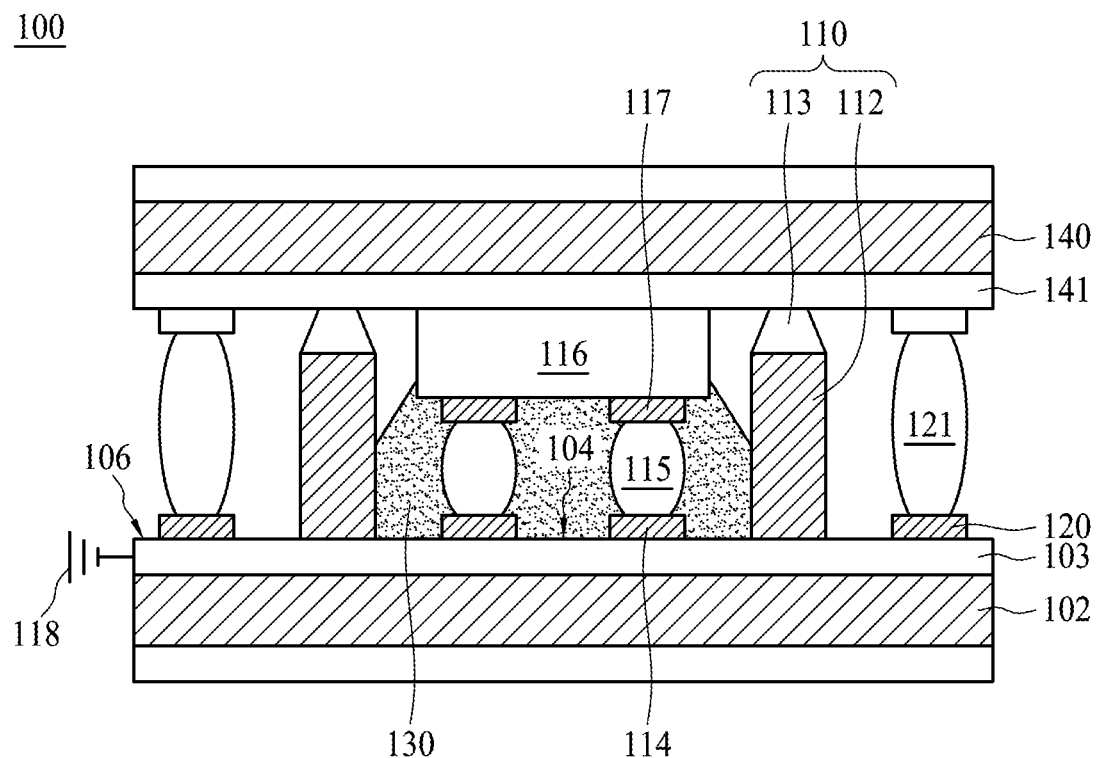
FIG. 1 is a schematic cross-sectional view of a semiconductor package in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

References to "one embodiment," "some embodiments," "an embodiment," "exemplary embodiment," "other embodiments," "another embodiment," etc. indicate that the embodiment(s) of the disclosure so described may include a particular feature, structure, or characteristic, but not every embodiment necessarily includes the particular feature, structure, or characteristic. Further, repeated use of the phrase "in the embodiment" does not necessarily refer to the same embodiment, although it may.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a schematic cross-sectional view of a semiconductor package 100 in accordance with some embodiments of the present disclosure. Referring to FIG. 1, in some embodiments, the semiconductor package 100 includes a first substrate 102, a blocking dam 110, and a first contact pad 120.

In some embodiments, the first substrate 102 includes a chip-mounting region 104 and an outer connecting region 106. Furthermore, the chip-mounting region 104 is different from the outer connecting region 106. The outer connecting region 106 is outside the chip-mounting region 104. In some embodiments, the first substrate 102 is a silicon substrate, a glass substrate, a ceramic substrate, or the like.

In some embodiments, a semiconductor chip 116 is mounted over the chip-mounting region 104 of the first substrate 102. For example, the semiconductor chip 116 may be an IC chip, a logic circuit or a memory chip, such as a DRAM, an SRAM, or the like.

In some embodiments, the first contact pad 120 is disposed over the first substrate 102. The first contact pad 120 is within the outer connecting region 106. In some embodiments, the first substrate 102 may be an interconnect structure with a plurality of through holes (not shown) filled with conductive material. In some embodiments, the first contact pad 120 is disposed on a top circuit layer 103 disposed over the first substrate 102. The top circuit layer 103 may be a redistribution layer (RDL). In some embodiments, the first contact pad 120 includes a layer of conductive material, such as copper, titanium, nickel, or the like.

In some embodiments, the blocking dam 110 is disposed over the first substrate 102. Moreover, the blocking dam 110 is disposed between the chip-mounting region 104 and the outer connecting region 106. The blocking dam 110 surrounds the chip-mounting region 104. In some embodiments, the blocking dam 110 includes a metal layer 112. In some embodiments, the metal layer 112 of the blocking dam 110 is electrically connected to a ground terminal 118, so that the semiconductor package 100 can protect the semiconductor chip 116 from electromagnetic disturbance caused by other adjacent chips. In some embodiments, the metal layer 112 may be electrically connected to the ground terminal 118 through the top circuit layer 103.

In some embodiments, the metal layer 112 may include conductive material, such as copper, titanium, nickel, or the like. The blocking dam 110 is formed by using a suitable deposition, such as a chemical vapor deposition (CVD) process, and a portion may be removed by using an etching process, a photolithographic process, or the like.

In some embodiments, a non-conductive layer 113 of the blocking dam 110 is disposed on the metal layer 112 of the blocking dam 110, and the non-conductive layer 113 is in contact with the metal layer 112 of the blocking dam 110 and the second substrate 140.

Figure 2:
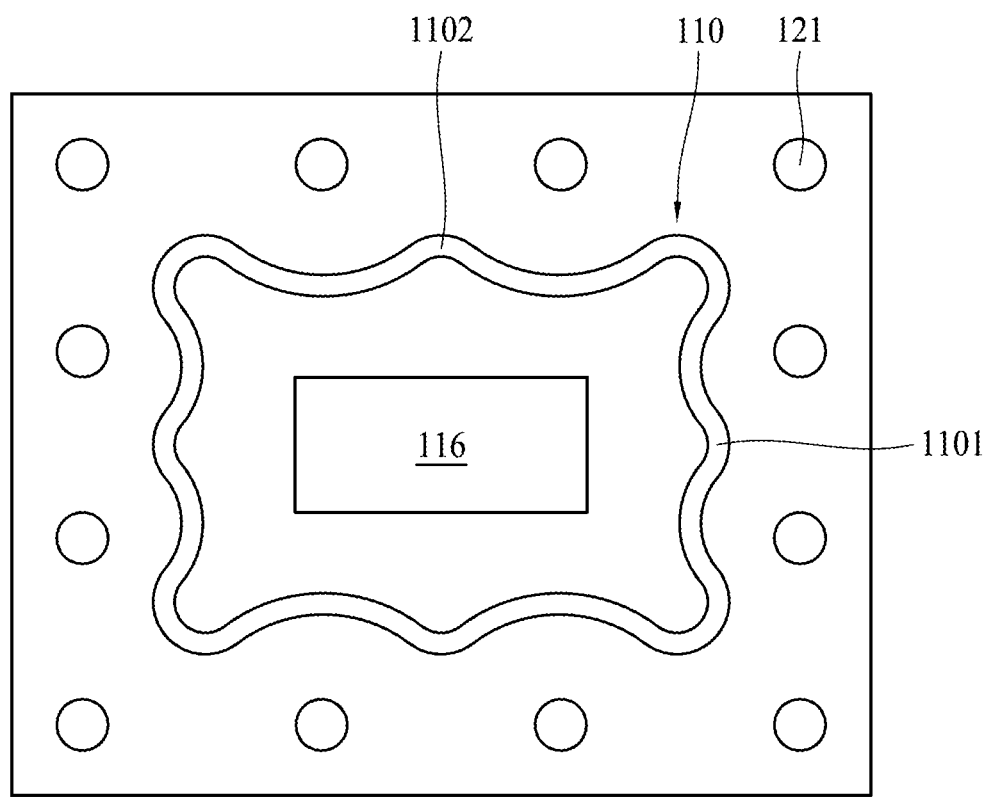
FIG. 2 is a top view of a first substrate in accordance with some embodiments of the present disclosure.

As shown in FIG. 2, the blocking dam 110 has a wave shape as seen in a top view of the blocking dam 110. In some embodiments, the blocking dam 110 has a first section 1101 of a two-wave shape. A wavelength of the two-wave shape is designed as a length suitable for reducing electromagnetic disturbance.

In some embodiments, the blocking dam 110 includes two first segments 1101 and two second segments 1102. The first segments 1101 are disposed and connected between the second segments 1102. The second segments 1102 are disposed and connected between the first segments 1101. The first segments 1101 are vertical segments. The second segments 1102 are horizontal segments. In some embodiments, each said first segment 1101 is of a wave shape, and each said second segment 1102 is of a wave shape.

Figure 3:
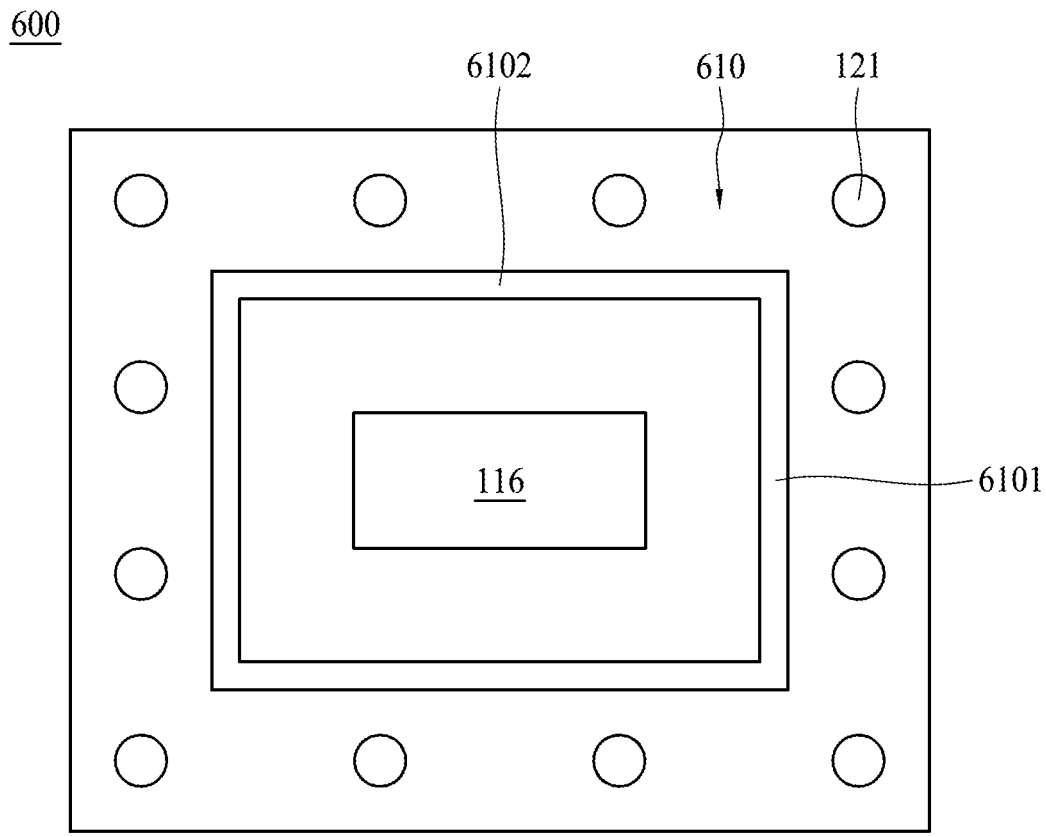
FIG. 3 is a top view of a semiconductor package in accordance with some embodiments of the present disclosure.

In other embodiments, in contrast to the blocking dam 110 of the semiconductor package 100 as shown in FIG. 2, another blocking dam 610 of a semiconductor package 600 as shown in FIG. 3 is provided. The blocking dam 610 is patterned as a chip alignment mark for placing the semiconductor chip in a correct position. The blocking dam 610 may include non-conductive material or metal material.

In some embodiments, the blocking dam 610 includes at least a first segment 6101. In some embodiments, the blocking dam 610 includes two first segments 6101 and two second segments 6102. The first segments 6101 are disposed and connected between the second segments 6102, and the second segments 6102 are disposed and connected between the first segments 6101. In some embodiments, the first segments 6101 are vertical and straight segments, and the second segments 6102 are horizontal and straight segments.

In some embodiments, the semiconductor chip 116 has a side wall 1161 adjacent to the first segment, and the side wall 1161 is parallel to the first segment.

In some embodiments, the blocking dam 610 includes at least a first segment 6101. In some embodiments, the blocking dam 610 includes two first segments 6101 and two second segments 6102. The first segments 6101 are disposed and connected between the second segments 6102, the second segments 6102 are disposed and connected between the first segments 6101, and the first segments 6101 are vertical and straight segments. In some embodiments, the second segments 6102 are horizontal and straight segments. In some embodiments, the semiconductor chip 116 has a side wall 1161 adjacent to the first segment 6101, and the side wall 1161 is parallel to the first segment 6101.

In some embodiments, the blocking dam 610 is formed by using a suitable deposition, such as a chemical vapor deposition (CVD) process, and a portion may be removed by using an etching process, a photolithographic process, or the like.

Apart from the blocking dam 610 of the semiconductor package 600 as shown in FIG. 3, other elements of the semiconductor package 600 are the same as elements of the semiconductor package 100 as shown in FIGS. 1 and 2.

As shown in FIGS. 1 and 2, in some embodiments, a second contact pad 114 is disposed over the outer connecting region 106, and the semiconductor chip 116 is electrically connected to the second contact pad 114 through a second connector 115. In some embodiments, the second connector 115 is electrically coupled to an electrode pad 117 of the semiconductor chip 116 and the top circuit layer 103 over the first substrate 102.

In some embodiments, an underfill material 130 is disposed over the first substrate 102. The underfill material 130 is within the chip-mounting region 104 and in contact with the blocking dam 110. The blocking dam 110 can prevent the underfill material 130 from overflowing. The underfill material 130 is disposed and filled between the semiconductor chip 116 and the first substrate 102.

In some embodiments, the second substrate 140 is disposed over the semiconductor chip 116. The second substrate 140 is electrically connected to the first contact pad 120 through a first connector 121, and the first connector 121 is higher than the second connector 115. In some embodiments, the second substrate 140 may be an interconnect structure with a plurality of through holes (not shown) filled with conductive material. In some embodiments, the first connector 121 is electrically connected to an under circuit 141 of the second substrate 140. In some embodiments, the first connector 121 or the second connector 115 is a conductive pillar, a solder ball, or the like.

Figure 4:
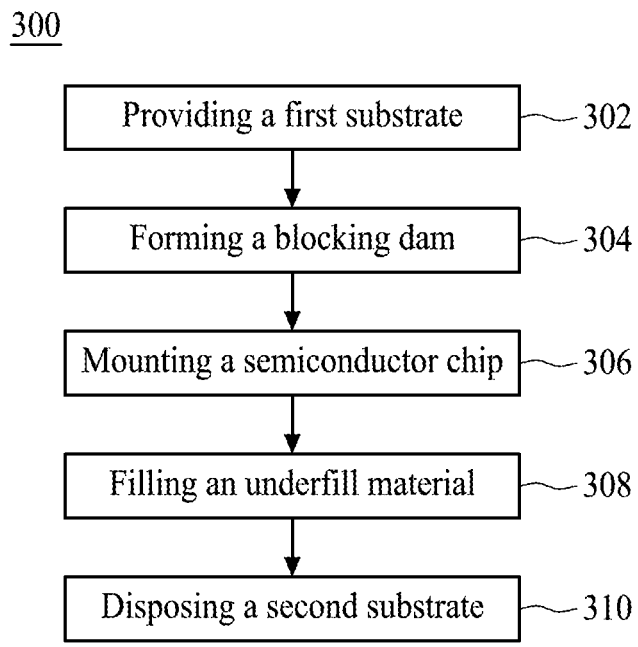
FIG. 4 is a flow diagram illustrating a method for manufacturing a semiconductor package in accordance with some embodiments of the present disclosure.
Figure 5:
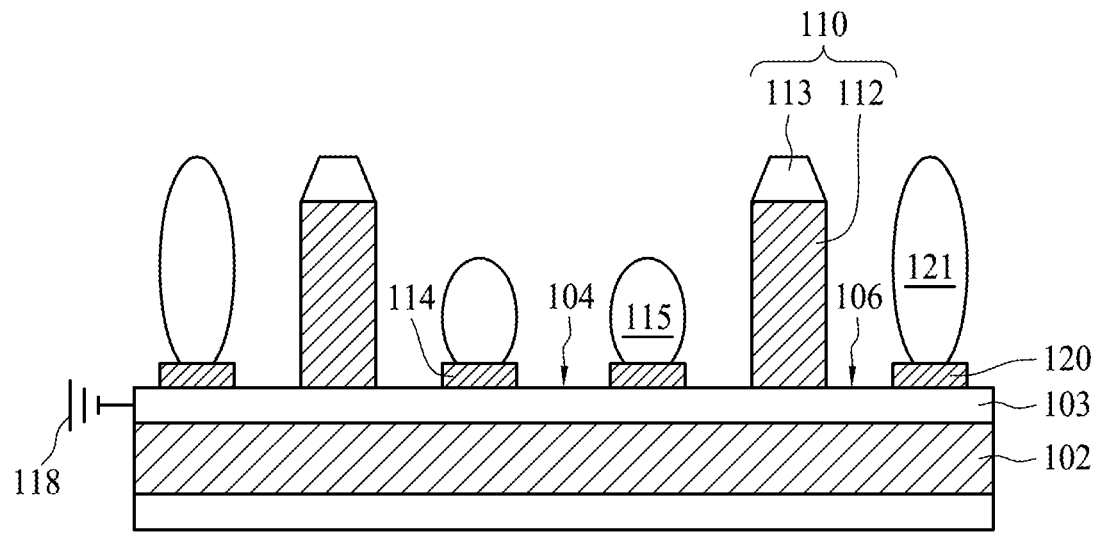
FIGS. 5 and 6 are schematic cross-sectional views during stages of manufacturing a semiconductor package by the method of FIG. 4 in accordance with some embodiments of the present disclosure.
Figure 6:
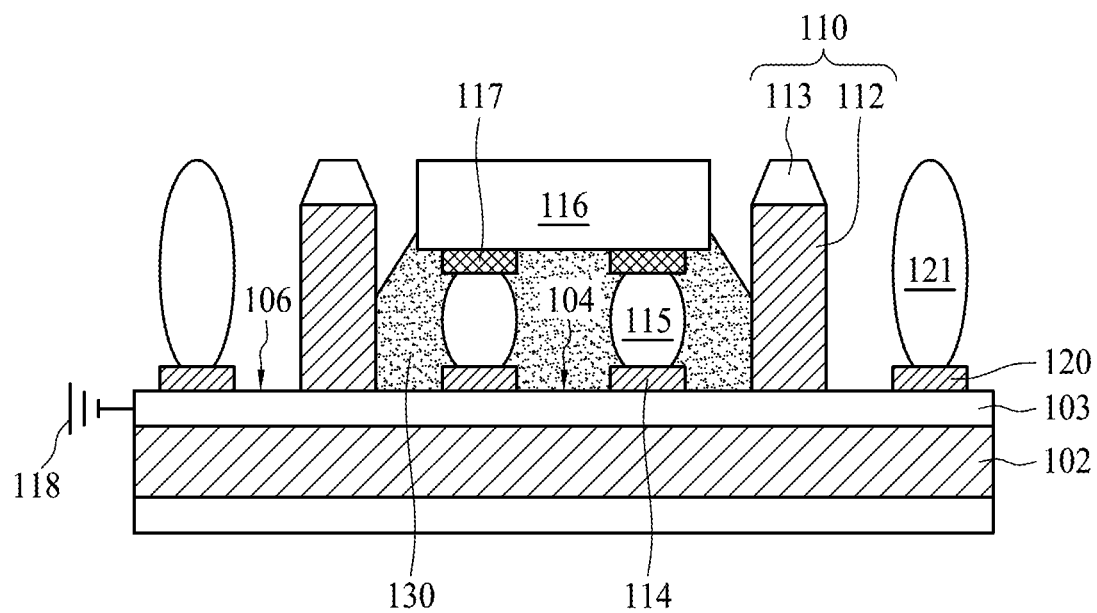

FIG. 4 is a flow diagram illustrating a method 300 for manufacturing a semiconductor package in accordance with some embodiments of the present disclosure. FIGS. 5 and 6 are schematic cross-sectional views of stages of manufacturing a semiconductor package in accordance with some embodiments of the present disclosure. In some embodiments, the method 300 includes a number of operations (302, 304, 306, 308, and 310), and the description and illustration below are not deemed as a limitation as the sequence of the operations.

In operation 302, a first substrate 102 is provided, as shown in FIG. 4. The first substrate 102 includes a chip-mounting region 104 and an outer connecting region 106. Furthermore, the chip-mounting region 104 is different from the outer connecting region 106. The outer connecting region 106 is outside the chip-mounting region 104. In some embodiments, the first substrate 102 is a silicon substrate, a glass substrate, a ceramic substrate, or the like.

In some embodiments, a first contact pad 120 is disposed over the first substrate 102. The first contact pad 120 is within the outer connecting region 106. In some embodiments, the first substrate 102 may be an interconnect structure with a plurality of through holes filled with conductive material. In some embodiments, the first contact pad 120 is disposed on a top circuit layer 103 disposed over the first substrate 102. The top circuit layer 103 may be a redistribution layer (RDL). In some embodiments, the first contact pad 120 includes a layer of conductive material, such as copper, titanium, nickel, or the like.

A first connector 121 is formed on the first contact pad 120. In some embodiments, a second contact pad 114 is formed over the first substrate 102. A second connector 115 is formed on the second contact pad 114. The second contact pad 114 is within the chip-mounting region 104. In some embodiments, the first connector 121 is taller than the second connector 115 so as to connect to another substrate. In some embodiments, the first connector 121 or the second connector is a conductive pillar, a solder ball, or the like.

In operation 304, a blocking dam 110 is formed over the first substrate 102. The blocking dam 110 is disposed between the chip-mounting region 104 and the outer connecting region 106, the blocking dam 110 surrounds the chip-mounting region 104 and includes a metal layer 112, and the blocking dam 110 is of a wave shape as seen in a top view of the blocking dam 110, as shown in FIG. 2 and FIG. 4.

In some embodiments, the blocking dam 110 includes two first segments 1101 and two second segments 1102. The first segments 1101 are disposed and connected between the second segments 1102. The second segments 1102 are disposed and connected between the first segments 1101. The first segments 1101 are vertical segments. The second segments 1102 are horizontal segments. In some embodiments, each said first segment 1101 is of a wave shape, and each said second segment 1102 is of a wave shape.

In some embodiments, the metal layer 112 of the blocking dam 110 is electrically connected to a ground terminal 118, so that the semiconductor package 100 can protect the semiconductor chip 116 from electromagnetic disturbance caused by other adjacent chips. The blocking dam 110 is formed through a suitable deposition, such as a chemical vapor deposition (CVD) process.

In some embodiments, a non-conductive layer 113 of the blocking dam 110 is disposed on the metal layer 112 of the blocking dam 110. In some embodiments, the non-conductive layer 113 is in contact with the metal layer 112 of the blocking dam 110 and the second substrate 140.

In operation 306, a semiconductor chip 116 is mounted over the chip-mounting region 104 of the first substrate 102, as shown in FIG. 5. In some embodiments, the semiconductor chip 116 is electrically coupled to the second contact pad 114 through the second connector 115. For example, the semiconductor chip 116 may be an IC chip, a logic circuit or a memory chip, such as a DRAM, an SRAM, or an NVRAM.

In operation 308, an underfill material 130 is filled between the semiconductor chip 116 and the first substrate 102, as shown in FIG. 1. In some embodiments, the underfill material 130 is within the chip-mounting region 104. The blocking dam 110 can prevent the underfill material 130 from overflowing. The underfill material 130 is disposed and filled between the semiconductor chip 116 and the first substrate 102.

In operation 310, a second substrate 140 is disposed over the semiconductor chip 116 as shown in FIG. 1. In some embodiments, the second substrate 140 is electrically connected to the first contact pad 120 through the first connector 121. In some embodiments, the second substrate 140 may be an inclining interconnect structure with a plurality of through holes filled with conductive material. In some embodiments, the first connector 121 is electrically connected to an under circuit 141 of the second substrate 140.

In conclusion, with the configuration of the semiconductor package, the semiconductor package may include the blocking dam to prevent the underfill material from overflowing.

In addition, the blocking dam includes a metal layer and is of a wave shape, so the semiconductor package can protect the chip thereof from electromagnetic disturbance caused by other adjacent chips.

In addition, the blocking dam can function as a chip alignment mark for mounting a semiconductor chip in a correct position. Thus, the blocking dam does not occupy more space than conventional semiconductor packages.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

One aspect of the present disclosure provides a semiconductor package. The semiconductor package comprises a first substrate including a chip-mounting region and an outer connecting region outside the chip-mounting region; a blocking dam disposed over the first substrate, wherein the blocking dam is disposed between the chip-mounting region and the outer connecting region, wherein the blocking dam surrounds the chip-mounting region and includes a metal layer, and the blocking dam is of a wave shape as seen in a top view of the blocking dam; and a first contact pad disposed over the first substrate, wherein the first contact pad is within the outer connecting region.

Another aspect of the present disclosure provides a semiconductor package. The semiconductor package comprises a first substrate including a chip-mounting region and an outer connecting region outside the chip-mounting region; a blocking dam disposed over the first substrate, wherein the blocking dam is disposed between the chip-mounting region and the outer connecting region, the blocking dam surrounds the chip-mounting region, and the blocking dam is patterned as a chip alignment mark; and a first contact pad disposed over the first substrate, wherein the first contact pad is within the outer connecting region.

Another aspect of the present disclosure provides a method for manufacturing a semiconductor package, comprising: providing a first substrate including a chip-mounting region and an outer connecting region outside the chip-mounting region; forming a blocking dam over the first substrate, wherein the blocking dam is disposed between the chip-mounting region and the outer connecting region, the blocking dam surrounds the chip-mounting region and includes a metal layer, and the blocking dam is of a wave shape as seen in a top view of the blocking dam, wherein a first contact pad is disposed over the first substrate, and the first contact pad is within the outer connecting region.

Another aspect of the present disclosure provides a method for manufacturing a semiconductor package, comprising: providing a first substrate including a chip-mounting region and an outer connecting region outside the chip-mounting region; and forming a blocking dam over the first substrate, wherein the blocking dam is disposed between the chip-mounting region and the outer connecting region, the blocking dam surrounds the chip-mounting region, and the blocking dam is patterned as a chip alignment mark, wherein a first contact pad is disposed over the first substrate and the first contact pad is within the outer connecting region.

The scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor package, comprising:
   a first substrate including a chip-mounting region and an outer connecting region outside the chip-mounting region;
   a blocking dam disposed over the first substrate, wherein the blocking dam is disposed between the chip-mounting region and the outer connecting region, wherein the blocking dam surrounds the chip-mounting region and includes a metal layer, and the blocking dam is of a wave shape as seen in a top view of the blocking dam; and
   a first contact pad disposed over the first substrate, wherein the first contact pad is within the outer connecting region.

2. The semiconductor package of claim 1, wherein the blocking dam has a first section of a two-wave shape.

3. The semiconductor package of claim 1, wherein the blocking dam includes two first segments and two second segments, the first segments are disposed and connected between the second segments, the second segments are disposed and connected between the first segments, the first segments are vertical segments, the second segments are horizontal segments, each said first segment is of a wave shape, and each said second segment is of a wave shape.

4. The semiconductor package of claim 1, further comprising a semiconductor chip mounted over the chip-mounting region of the first substrate.

5. The semiconductor package of claim 4, further comprising a second contact pad disposed over the outer connecting region, wherein the semiconductor chip is electrically connected to the second contact pad through a second connector.

6. The semiconductor package of claim 5, further comprising an underfill material disposed over the first substrate, wherein the underfill material is within the chip-mounting region and in contact with the blocking dam, and the underfill material is disposed between the semiconductor chip and the first substrate.

7. The semiconductor package of claim 6, further comprising: a second substrate disposed over the semiconductor chip, wherein the second substrate is electrically connected to the first contact pad through a first connector, and the first connector is higher than the second connector.

8. The semiconductor package of claim 7, wherein a non-conductive layer of the blocking dam is in contact with the metal layer of the blocking dam and the second substrate.

9. The semiconductor package of claim 1, wherein the metal layer of the blocking dam is electrically connected to a ground terminal.

10. A semiconductor package, comprising:
    a first substrate including a chip-mounting region and an outer connecting region outside the chip-mounting region;
    a blocking dam disposed over the first substrate, wherein the blocking dam is disposed between the chip-mounting region and the outer connecting region, the blocking dam surrounds the chip-mounting region, and the blocking dam is patterned as a chip alignment mark; and a first contact pad disposed over the first substrate, wherein the first contact pad is within the outer connecting region.

11. The semiconductor package of claim 10, wherein the blocking dam includes a metal layer.

12. The semiconductor package of claim 10, wherein the blocking dam includes a first segment, the semiconductor chip has a side wall adjacent to the first segment, and the side wall is parallel to the first segment.

13. The semiconductor package of claim 10, wherein the blocking dam includes two first segments and two second segments, the first segments are disposed and connected between the second segments, the second segments are disposed and connected between the first segments, the first segments are vertical and straight segments, and the second segments are horizontal and straight segments.

14. The semiconductor package of claim 10, further comprising a semiconductor chip mounted over the chip-mounting region of the first substrate, wherein the semiconductor chip is electrically connected to the second contact pad through a second connector.

15. The semiconductor package of claim 14, further comprising an underfill material disposed over the first substrate, wherein the underfill material is within the chip-mounting region and in contact with the blocking dam, and the underfill material is disposed between the semiconductor chip and the first substrate.

16. The semiconductor package of claim 15, further comprising a second substrate disposed over the semiconductor chip, wherein the second substrate is electrically connected to the first contact pad through a first connector, and the first connector is taller than the second connector.

17. A method for manufacturing a semiconductor package, comprising:

providing a first substrate including a chip-mounting region and an outer connecting region outside the chip-mounting region; and forming a blocking dam over the first substrate, wherein the blocking dam is disposed between the chip-mounting region and the outer connecting region, the blocking dam surrounds the chip-mounting region and includes a metal layer, and the blocking dam is of a wave shape as seen in a top view of the blocking dam, wherein a first contact pad is disposed over the first substrate, and the first contact pad is within the outer connecting region.

18. The method of claim 17, further comprising:

forming a second contact pad over the first substrate and forming a second connector on the second contact pad, wherein the second contact pad is within the chip-mounting region;

mounting a semiconductor chip over the chip-mounting region of the first substrate, wherein the semiconductor chip is electrically coupled to the second contact pad through the second connector; and filling an underfill material between the semiconductor chip and the first substrate, wherein the underfill material is within the chip-mounting region.

19. The method of claim 18, further comprising:

forming a first connector on the first contact pad, wherein the first connector is taller than the second connector; and disposing a second substrate over the semiconductor chip, wherein the second substrate is electrically connected to the first contact pad through the first connector.

20. The method of claim 17, further comprising: electrically coupling the metal layer of the blocking dam to a ground terminal.

* * * * *